(12) United States Patent
Shin

(10) Patent No.: US 6,949,773 B2
(45) Date of Patent: Sep. 27, 2005

(54) GAN LED FOR FLIP-CHIP BONDING AND METHOD OF FABRICATING THE SAME

(75) Inventor: Hyoun Soo Shin, Seoul (KR)

(73) Assignee: Samsung Electro-Mechanics Co., LTD, Kyungki-Do (KR)

( * ) Notice: Subject to any disclaimer, the term of this patent is extended or adjusted under 35 U.S.C. 154(b) by 0 days.

(21) Appl. No.: 10/701,562

(22) Filed: Nov. 6, 2003

(65) Prior Publication Data

US 2004/0256631 A1 Dec. 23, 2004

(30) Foreign Application Priority Data

Jun. 23, 2003 (KR) .................................. 10-2003-0040796

(51) Int. Cl.⁷ .............................................. H01L 33/00
(52) U.S. Cl. ........................ 257/99; 257/778; 438/38; 438/47; 438/604
(58) Field of Search ................................ 257/99, 778

(56) References Cited

U.S. PATENT DOCUMENTS

| | | | |
|---|---|---|---|
| 5,696,389 A | * | 12/1997 | Ishikawa et al. ............... 257/99 |
| 5,914,501 A | | 6/1999 | Antle et al. |
| 6,078,064 A | | 6/2000 | Ming-Jiunn et al. |
| 6,307,218 B1 | * | 10/2001 | Steigerwald et al. .......... 257/99 |
| 6,333,522 B1 | | 12/2001 | Inoue et al. |
| 6,380,564 B1 | * | 4/2002 | Chen et al. .................... 257/99 |
| 6,455,878 B1 | * | 9/2002 | Bhat et al. ..................... 257/99 |
| 6,614,172 B2 | | 9/2003 | Chiu et al. |
| 6,650,018 B1 | * | 11/2003 | Zhao et al. .................. 257/775 |

* cited by examiner

Primary Examiner—Jerome Jackson
(74) Attorney, Agent, or Firm—Lowe Hauptman & Berner, LLP

(57) ABSTRACT

A GaN light emitting diode for flip-chip bonding, with sufficient bonding area, optimized electrode arrangement, and improved brightness and reliability, includes n-electrodes and a p-electrode which are formed as stripes. The n-electrodes are positioned at equal distances from the p-electrode and arranged in parallel, thus the electric current is not concentrated into a predetermined portion, but uniformly flows through the light emitting diode without reducing a light emitting area.

21 Claims, 10 Drawing Sheets

GAN LED FOR FLIP-CHIP BONDING AND METHOD OF FABRICATING THE SAME

BACKGROUND OF THE INVENTION

1. Field of the Invention

The present invention pertains, in general, to a light emitting diode (LED) and, in particular, to a GaN light emitting diode for a flip-chip bonding, which secures a sufficient bonding area while optimizing an electrode arrangement, prevents an electric current from concentrating on a predetermined portion, and has higher brightness and reliability, and a method of fabricating the same.

2. Description of the Related Art

Acting as a semiconductor device emitting light by the recombination of electrons with holes, a light emitting diode (LED) is widely used as a light source in light communication devices and electronic devices.

A frequency of light emitted from the light emitting diode is utilized as a band-gap function of a material used in the semiconductor device. A wavelength of the light, in place of the frequency, may be used as the band-gap function. In the case of using the semiconductor material with a small band gap, the light emitting diode emits photons with low energy and long wavelengths. On the other hand, in the case of using the semiconductor material with a wide band gap, the light emitting diode emits photons with short wavelengths.

For example, when AlGaInP is used as a material in a semiconductor device, the light emitting diode emits light with red wavelength, and when a SiC or III group nitride (particularly, GaN) semiconductor device is used, the light emitting diode emits light with blue or violet wavelengths.

Of the various semiconductor materials, a Ga-based light emitting diode does not form a bulk single crystal of GaN, thus a substrate proper to grow the GaN crystal must be used and a representative material of the substrate is sapphire (i.e. aluminum oxide ($Al_2O_3$)).

FIG. 1 is a sectional view of a conventional GaN light emitting diode. The GaN light emitting diode 10 includes a sapphire substrate 11, a GaN light emitting structure 13 formed on the sapphire substrate 11, and a p-electrode 15 and an n-electrode 16 formed on the GaN light emitting structure 13.

The GaN light emitting structure 13 includes a n-type GaN clad layer 13a, an activation layer with a multi-quantum well structure 13b, and a p-type GaN clad layer 13c, which are sequentially formed on the sapphire substrate 11. In this regard, the GaN light emitting structure 13 is formed according to a metal organic chemical vapor deposition (MOCVD) process. At this time, a buffer layer (not shown) including an AlN/GaN may be formed so as to improve the lattice matching of the GaN light emitting structure 13 with the sapphire substrate 11 before the n-type GaN clad layer 13a of the GaN light emitting structure 13 is built.

Additionally, the p-type GaN clad layer 13c and the activation layer 13b of the GaN light emitting structure 13 are dry-etched to expose a portion of the n-type GaN clad layer 13a.

The n-electrode 16 and p-electrode 15 are respectively formed on the exposed portion of the n-type GaN clad layer 13a and a portion of the p-type GaN clad layer 13c which is not etched, so that a predetermined voltage is applied through the p- and n-electrodes 15, 16. In this regard, a transparent electrode 14 may be formed on the p-type GaN clad layer 13c before the p-electrode 15 is formed on the p-type GaN clad layer 13c so as to increase a current implant area and so as to prevent deterioration of the brightness of the light emitted from the light emitting diode.

The GaN light emitting diode may be formed in a package in accordance with a die bonding process using a chip side up manner. At this time, the light emitting diode must emit light in a direction toward which the p-electrode 15 and n-electrode 16 are formed, but the light emitting diode does not emit the light at a portion in which the two electrodes 15, 16 are formed. Additionally, heat is discharged from the light emitting diode at a slow speed when the light emitting diode emits the light because of the low thermal conductivity of sapphire constituting the substrate, thus the life span of the light emitting diode is reduced.

To avoid the above disadvantages, many studies on a light emitting diode for a flip-chip have been conducted, in which the light emitting diode 10 of FIG. 1 is upset to mount the p-electrode 15 and n-electrode 16 on a printed circuit board or a lead frame according to a die-bonding process, thereby accomplishing a flip-chip bonding. At this time, the light emitting diode emits light through the sapphire substrate 11.

FIG. 2A is a plan view illustrating a conventional light emitting diode with a flip-chip structure and FIG. 2B is a sectional view taken along the line A—A of FIG. 2A, and FIGS. 2A and 2B are shown in U.S. Pat. No. 6,333,522 (title: Light-emitting element, semiconductor light-emitting device, and manufacturing methods therefor, Registration date: Dec. 25, 2001).

As described above, a light emitting diode 20 includes a buffer layer 22, an n-type GaN clad layer 23a, an activation layer 23b, and a p-type GaN clad layer 23c sequentially formed on a sapphire substrate, and the activation layer 23b and p-type GaN clad layer 23c are dry-etched. After a portion of the n-type GaN clad layer 23a is exposed, an n-electrode 26 is formed on the exposed portion of the n-type GaN clad layer 23a, and a p-electrode 25 is formed on a portion of the p-type GaN clad layer 23c which is not etched. Additionally, a transparent electrode 24 is layered between the p-type GaN clad layer 23c and p-electrode 25.

Subsequently, microbumps 27, 28 made of Au or an Au alloy are formed on the p-electrode 25 and the n-electrode 26, respectively.

The light emitting diode 20 of FIG. 2 is mounted on a lead frame of an LED device by bonding the microbumps 27, 28 of the light emitting diode to the lead frame.

However, the light emitting diode of U.S. Pat. No. 6,333,522 is disadvantageous in that the life span of the light emitting diode is reduced because an optimum, uniform electrical current is not obtained through the light emitting diode and the electrical current applied to the light emitting diode during the operation of the light emitting diode is concentrated into a predetermined portion of the device even though the light emitting diode is integrated with a Si diode element and a substrate to reduce an electrical connection area and increase the brightness and light emitting efficiency.

SUMMARY OF THE INVENTION

Accordingly, it is an aspect of the present invention to avoid the disadvantages, and to provide a GaN light emitting diode for a flip-chip bonding, which optimizes an electrode arrangement, secures a sufficient bonding area, and improves the brightness and the reliability, and a method of fabricating the GaN light emitting diode.

The above and/or other aspects are achieved by providing a GaN light emitting diode for a flip-chip bonding, including a sapphire substrate, and a light emitting structure including a first GaN clad layer, an activation layer, and a second GaN clad layer sequentially formed on the sapphire substrate. At this time, the first GaN clad layer is exposed at one or more portions thereof in a shape of a lane with a predetermined width. A plurality of first electrodes and a second electrode are respectively formed on the exposed portions of the first GaN clad layer and the second GaN clad layer. The first electrodes and second electrode are formed in the shapes of lines with minimum widths and positioned parallel to each other. Additionally, a passivation layer is formed on the light emitting structure and the first and second electrodes and punched at portions thereof to protect the portions of the first and second electrodes and the light emitting structure. A first and a second bonding electrode are formed on the passivation layer as a way to insulate each other and connect to the first and second electrodes through punched portions of the passivation layer.

Further, both opposite ends of the activation layer and second GaN clad layer are etched in a shape of a lane to form the light emitting structure, the first electrodes are formed on both opposite ends of the first GaN clad layer constituting the light emitting structure in the shapes of lines with minimum widths, and the second electrode is formed on the second GaN clad layer in a shape of a line with a minimum width and is positioned parallel to the first electrodes. In this regard, the second electrode is positioned at a center of the light emitting structure. Thereby, an electrical current uniformly flows through the light emitting diode, thus preventing a life span shortening of the light emitting diode caused by the concentration of the electrical current into a predetermined portion.

The GaN light emitting diode may further include a reflective layer positioned between the passivation layer and the first and second bonding electrode.

The above and/or other aspects are achieved by providing a method of fabricating a GaN light emitting diode for a flip-chip bonding, including sequentially building a first GaN clad layer, an activation layer, and a second GaN clad layer on a sapphire substrate, etching predetermined portions of the activation layer and second GaN clad layer to expose predetermined portions of the first GaN clad layer, forming a transparent electrode on the second GaN clad layer, simultaneously forming first and second electrodes on the transparent electrode and exposed portions of the first GaN clad layer in such a way that the first and second electrodes form lines with minimum widths and are positioned parallel to each other, passivationing upper portions of the first and second GaN clad layers on which the first and second electrodes are formed to form a passivation layer, and punching the passivation layer to expose predetermined portions of the first and second electrodes, and forming a first and a second bonding electrode on the passivation layer as a way to insulate each other and connect to the first and second electrodes through punched portions of the passivation layer.

The etching is conducted in such a way that both opposite ends of the activation layer and second GaN clad layer are mesa-etched.

Further, the forming of the first and second electrodes is conducted in such a way that two first electrodes coming into contact with the first GaN clad layer are positioned at both opposite ends of the first GaN clad layer, and the second electrode coming into contact with the second GaN clad layer is positioned at equal distances from the two first electrodes between the two first electrodes.

The first and second electrodes are 10 to 20 $\mu$m in width.

Furthermore, the method also includes forming a reflective layer on the passivation layer before forming the first and second bonding electrode.

Additionally, the first and second electrodes are made of a metal including a reflective material, a barrier material, and a bonding material.

The reflective layer or reflective material is made of a material selected from the group consisting of Ag, Al, Pd, Rh, and an alloy thereof, the barrier material is selected from the group consisting of Ti, W, Cr, Pt, Ni, and an alloy thereof, and the bonding material is selected from the group consisting of Au, Sn, In, and an alloy thereof.

BRIEF DESCRIPTION OF THE DRAWINGS

These and other aspects and advantages of the invention will become apparent and more readily appreciated from the following description of the preferred embodiments, taken in conjunction with the accompanying drawings of which.

DESCRIPTION OF THE PREFERRED EMBODIMENTS

Figure 1:
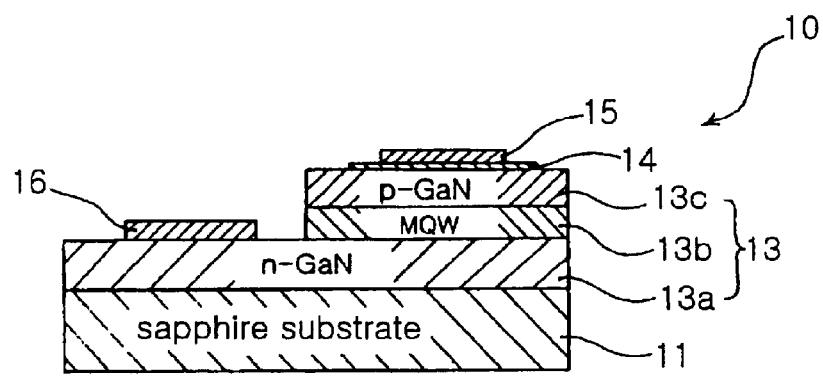
FIG. 1 is a sectional view of a conventional GaN light emitting diode.
Figure 2A:
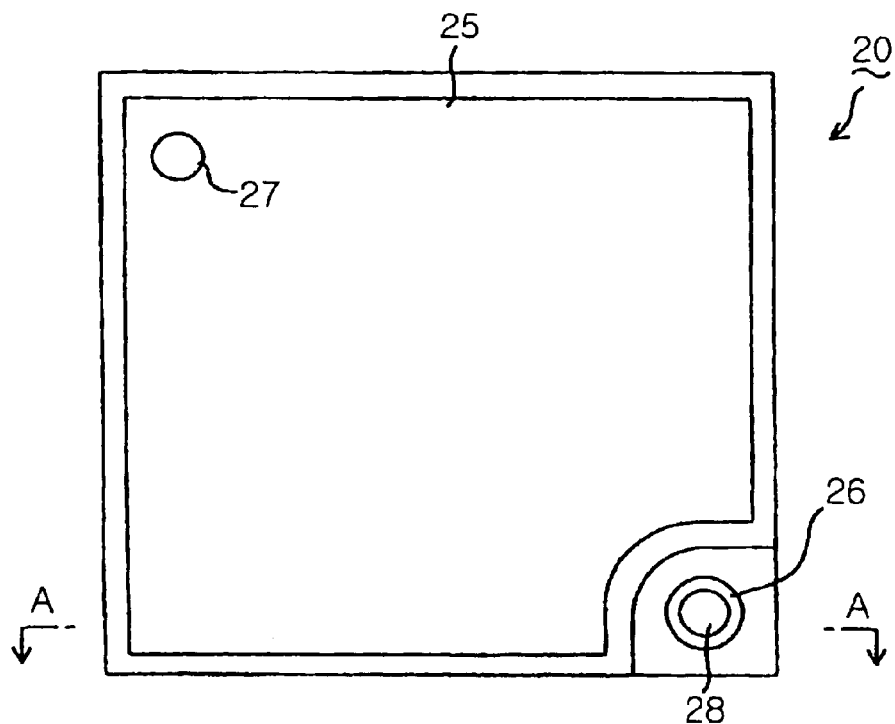
FIGS. 2A and 2B are a plan view and a sectional view of a conventional GaN light emitting diode for a flip-chip bonding, respectively.
Figure 2B:
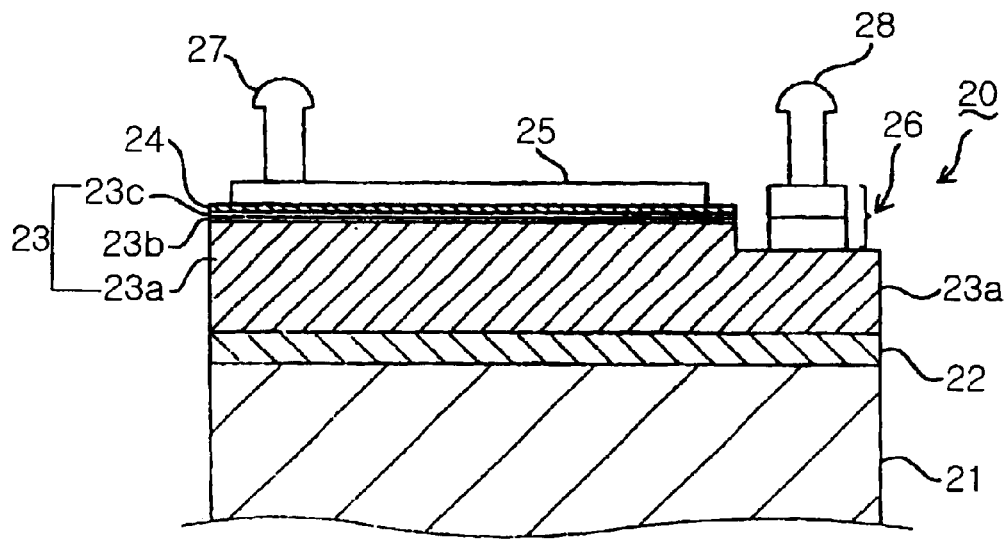

Reference will now be made in detail to the present preferred embodiments of the present invention, examples of which are illustrated in the accompanying drawings, wherein like reference numerals refer to like elements throughout.

Figure 3:
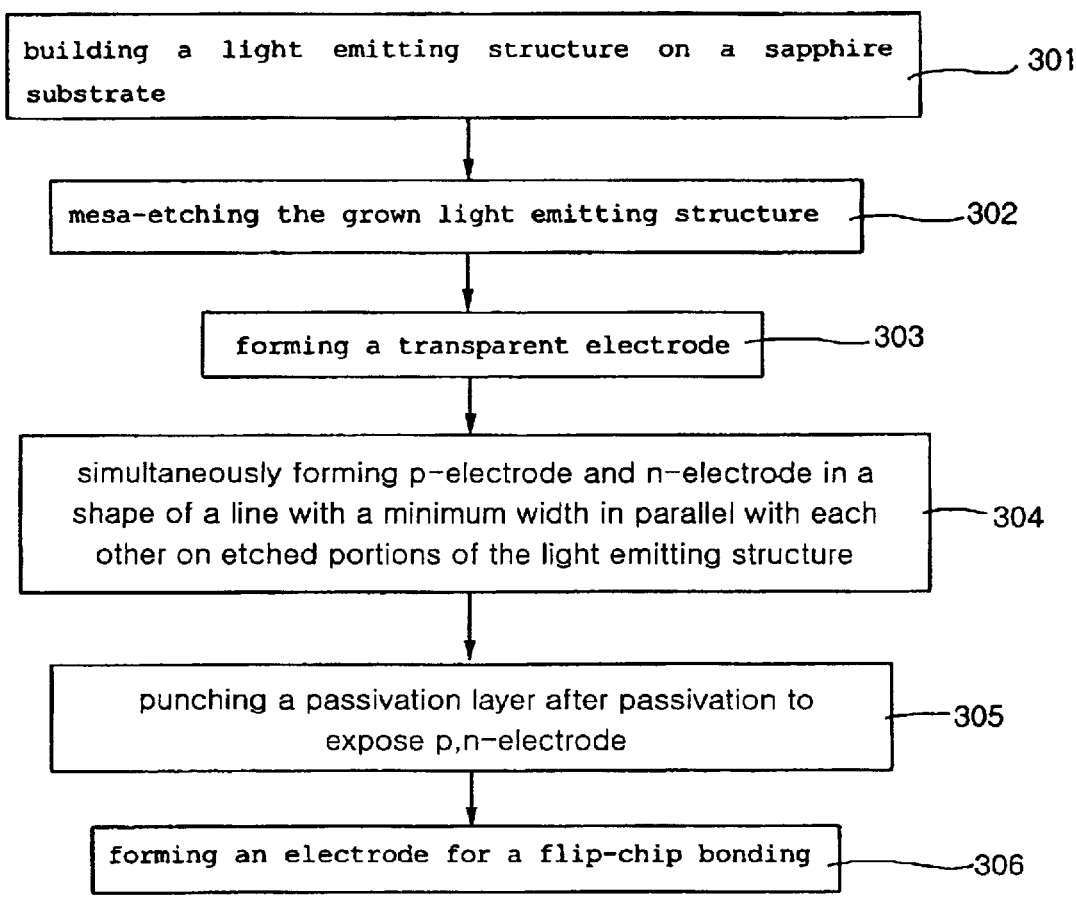
FIG. 3 is a flowchart illustrating the fabrication of a GaN light emitting diode for a flip-chip bonding according to the present invention.

FIG. 3 is a flowchart illustrating the fabrication of a GaN light emitting diode for a flip-chip bonding according to the present invention, and FIGS. 4A to 4E sectional views illustrating the fabrication of the GaN light emitting diode according to the present invention.

According to the present invention, a light emitting structure is built on a sapphire substrate in operation 301.

Figure 4A:
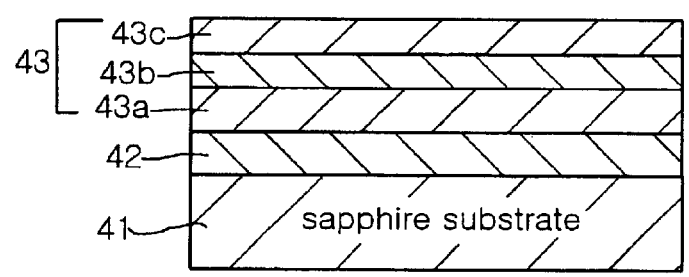
FIGS. 4A to 4E sectional views illustrating the fabrication of the GaN light emitting diode according to the present invention.

FIG. 4A is a sectional view illustrating the light emitting structure 43 formed on the sapphire substrate 41. The light emitting structure 43 is built on the sapphire substrate 41 in such a way that an n-type GaN clad layer 43a as a first GaN clad layer, an activation layer 43b with a multi-quantum well structure, a p-type GaN clad layer 43c as a second GaN clad layer are sequentially formed on the sapphire substrate 41. At this time, the light emitting structure is built according to a traditional MOCVD process, and a buffer layer 42 is formed on the sapphire substrate 41 so as to improve the lattice matching of the light emitting structure 43 with the sapphire substrate 41 before the light emitting structure 43 is formed on the sapphire substrate 41.

Predetermined portions of the p-type GaN clad layer 43c and activation layer 43b constituting the light emitting structure 43 are then etched in operation 302.

Figure 4B:
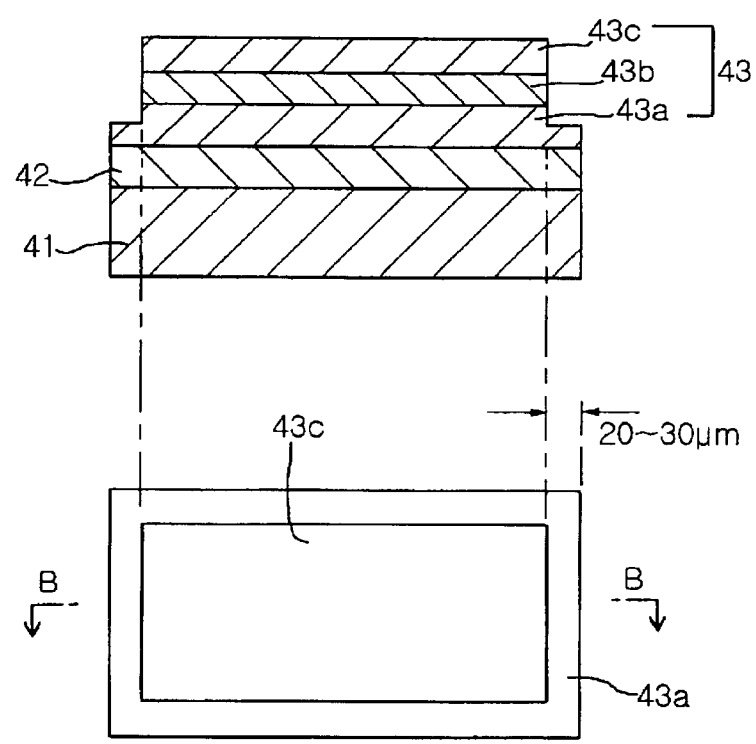

In the operation 302, as shown in FIG. 4B, both opposite edge parts of the p-type GaN clad layer 43c and activation layer 43b constituting the light emitting structure 43 are etched to a width from about 20 to 30 μm.

Figure 4C:
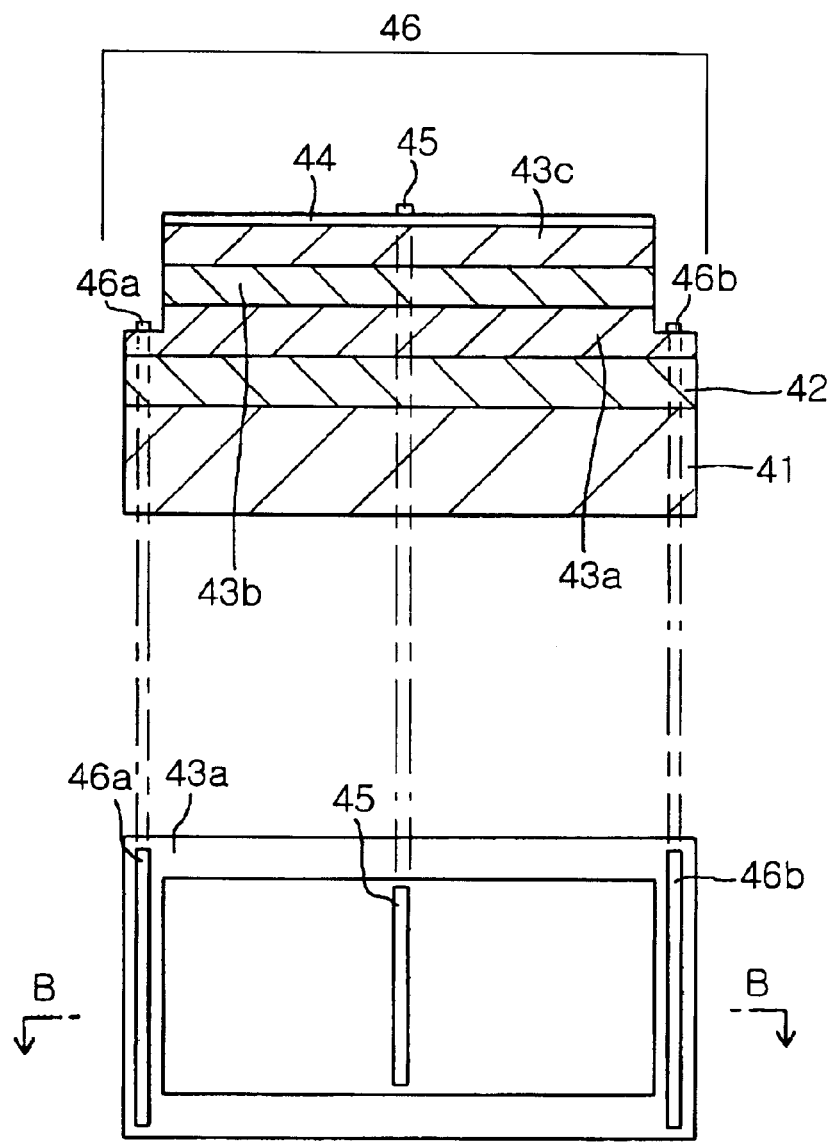

As in FIG. 4C, a transparent electrode 44 is formed on the p-type GaN clad layer 43c of the light emitting structure 43 in operation 303. The transparent electrode 44 is made of a material which does not degrade the brightness or increase an electrical current implant area, for example, Ni/Au. If necessary, the formation of the transparent electrode 44 in the operation 303 may be omitted.

Additionally, an n-electrode 46 as a first electrode and a p-electrode 45 as a second electrode are simultaneously formed on the n-type GaN clad layer 43a and the transparent electrode 44 (the p-type GaN clad layer 43c in the case of omitting the transparent electrode 44), respectively.

In this regard, as shown in FIG. 4C, the n-type electrode 46 is formed in such a way that the two line electrodes 46a, 46b are formed on both opposite end parts of the first GaN clad layer 43a, and the line-shaped p-electrode 45 is formed on the transparent electrode 44 (on the p-type GaN clad layer 43c in the case of omitting the transparent electrode 44) and positioned between the two line electrodes 46a, 46b in such a way that the p-electrode 45 is positioned at equal distances from the two line electrodes 46a, 46b.

At this time, the p-electrode and n-electrode 45, 46 all have as narrow width as possible, and for example, the widths of the p- and n-electrode 45, 46 may be 10 to 20 μm. It is preferable that the lengths of the p-electrode and n-electrode 45, 46 are almost the same as a length of a light emitting diode chip.

After the p- and n-electrode 45, 46 are formed, a transparent, nonconductive passivation layer 47 is formed on the resulting structure to protect the light emitting diode chip. In this regard, portions of the passivation layer are punched so as to expose portions of the electrodes 45, 46 or the whole body of the electrodes 45, 46 in operation 305.

Figure 4D:
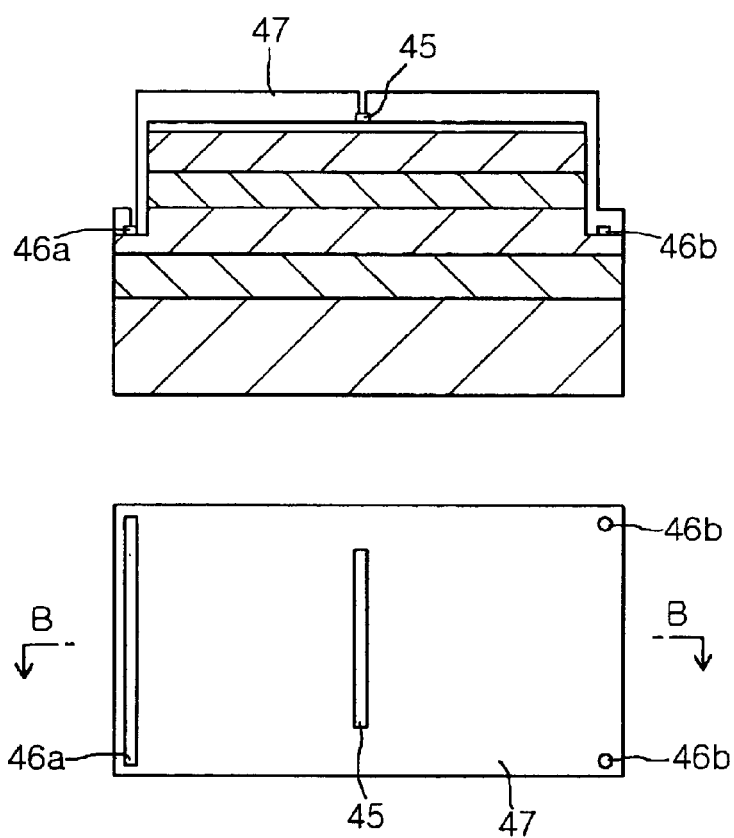

FIG. 4D illustrates a sectional view and a plan view of the passivation layer 47 formed on the light emitting structure in the operation 305. In FIG. 4D, a portion of the passivation layer 47 corresponding in position to one electrode 46a of the two n-electrodes is punched (a shape of the portion of the passivation layer which is punched is a line with a predetermined length and width, like the shape of the electrode 46a), and other portions of the passivation layer 47 corresponding in position to the other electrode 46b are punched in a shape of two holes at portions of the passivation layer 47 corresponding in position to both ends of the line-shaped electrode 46b. Additionally, a portion of the passivation layer 47 corresponding in position to the p-electrode 45 is punched in the same shape as the p-electrode 45 (i.e. line with the same width and length as the p-electrode).

Figure 4E:
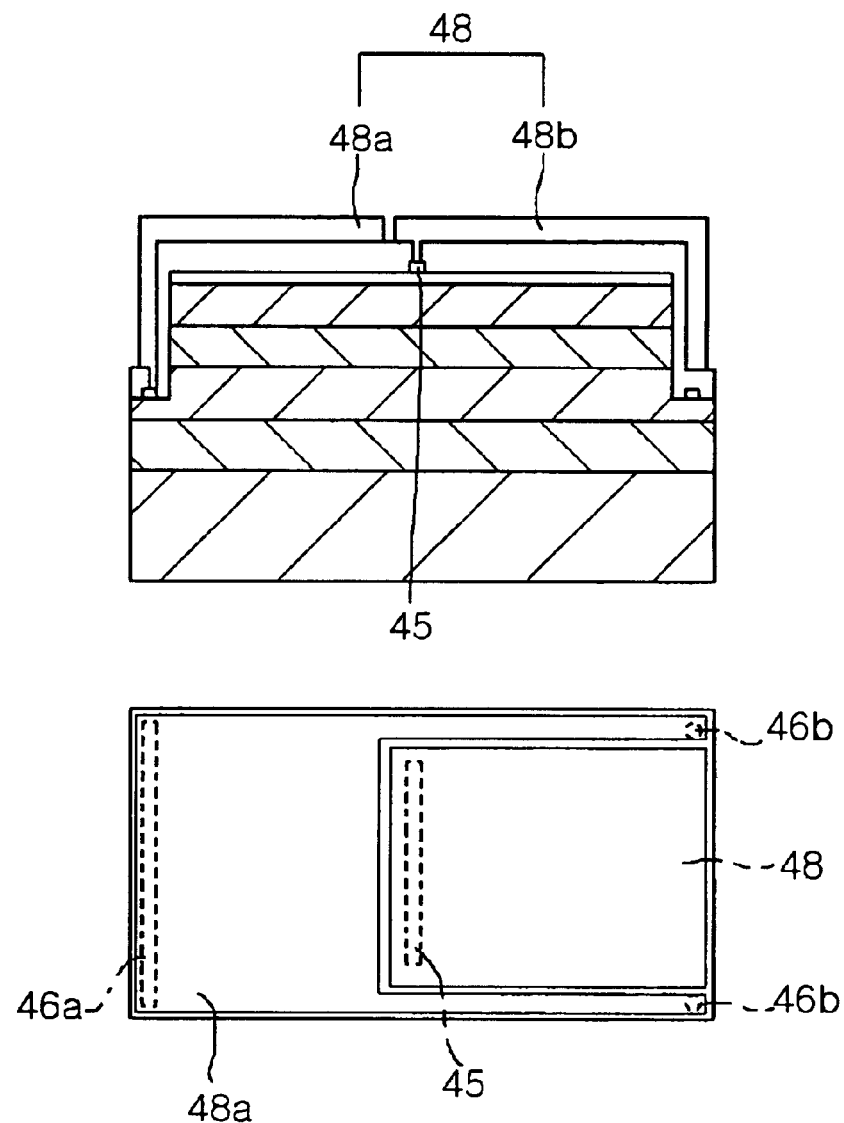

The passivation layer 47 is punched so as to electrically connect the n- and p-electrode 46, 45 to a bonding electrode 48 of FIG. 4E, and shapes of the punched portions of the passivation layer 47 may be variable.

A first and a second bonding electrode 48a, 48b are formed on the passivation layer 47 as a way to come into contact with the n-electrode 46 and the p-electrode 45, respectively. At this time, the first and second bonding electrode 48a, 48b insulate each other.

FIG. 4E illustrates a sectional view and a plan view of the light emitting diode chip in which the first and second bonding electrode 48a, 48b are formed on the passivation layer 47. The first bonding electrode 48a is formed in a shape of '[' and covers a left portion of the passivation layer 47 based on a position of the p-electrode 45. On the other hand, the second bonding electrode 48b covers a portion of the passivation layer 47 corresponding in position to the p-electrode 45 and a right portion of the passivation layer 47. The first and second bonding electrode 48a, 48b function to transfer an electric current applied from outside to the light emitting diode chip into the n- and p-electrodes 46, 45, and are bonded to a substrate or lead frame. Further, the first and second bonding electrodes 48a, 48b are formed over the entire light emitting diode chip so as to secure a sufficient bonding area, and insulate each other while connecting to the n-electrode 46 and the p-electrode 47. As well, the shapes of the first and second bonding electrodes 48a, 48b may be not limited, but may be varied.

As described above, the light emitting diode of the present invention has the n-electrode 46 and the p-electrode 45 with a minimized area constituting the light emitting structure 43.

Furthermore, the two n-electrodes 46a, 46b are positioned at equal distances from the p-electrode 45 and arranged in parallel, thus the electric current is not concentrated into a predetermined portion, but uniformly flows.

Accordingly, the present invention is advantageous in that a desirable, uniform current transfer effect is secured without reducing a light emitting area.

In addition, the light emitting diode of the present invention includes the first and second bonding electrodes 48a, 48b as well as the n-electrode 46 and the p-electrode 45, thus a sufficient bonding area is secured. Furthermore, heat from the chip easily is discharged while operating the light emitting diode chip because the light emitting diode chip is flip-chip bonded to a Si sub-mount with excellent conductivity through the first and second bonding electrodes 48a, 48b.

Moreover, a reflective layer may be formed on the passivation layer 47 so as to improve the brightness before the first and second bonding electrodes 48a, 48b are formed.

Additionally, the first and second bonding electrodes 48a, 48b may be made of a reflective material, a barrier material, and a bonding material so as to improve the reflective and barrier effects.

In this regard, the reflective material is selected from the group consisting of Ag, Al, Pd, Rh, and an alloy thereof, the barrier material is selected from the group consisting of Ti, W, Cr, Pt, Ni, and an alloy thereof, and the bonding material is selected from the group consisting of Au, Sn, In, and an alloy thereof.

As described above, a yttrium aluminum garnet (YAG) is not necessarily inserted between the light emitting diode chip 40 and a Si substrate while the light emitting diode chip 40 is flip-chip bonded to the Si substrate because the first and second bonding electrodes 48a, 48b act as a reflective layer, thereby avoiding problems due to the use of the YAG. Further, it is not necessary to use a under-fill while a white light emitting diode is operated.

Figure 5:
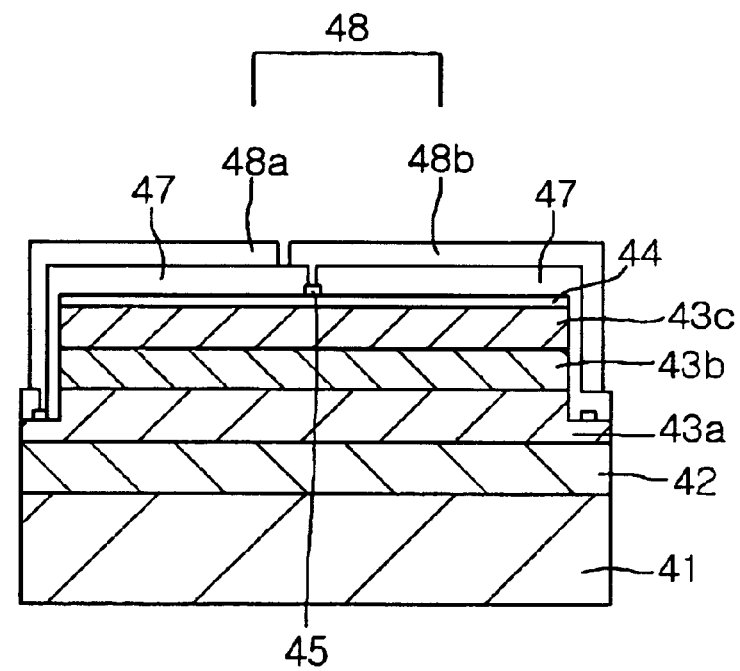
FIG. 5 is a sectional view of the GaN light emitting diode according to the present invention.
Figure 5:
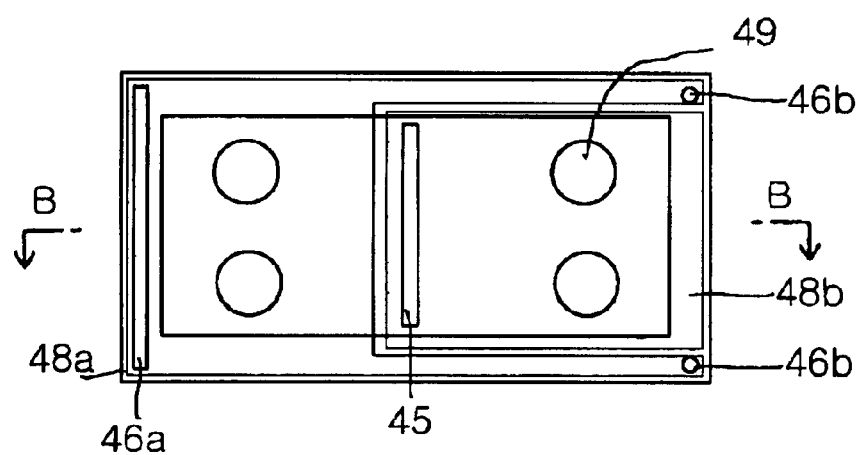

FIG. 5 is a sectional view and a plan view illustrating the light emitting diode chip according to the present invention. The light emitting diode 40 includes a sapphire substrate 41, and a light emitting structure 43 including an n-type GaN clad layer 43a, an activation layer 43b, and a p-type GaN clad layer 43c sequentially formed on the sapphire substrate 41. At this time, the n-type GaN clad layer 43a is exposed at one or more portions thereof in a shape of a lane with a predetermined width. A transparent electrode 44 is formed on the p-type GaN clad layer 43c of the light emitting structure 43. Additionally, a plurality of n-electrodes 46 and p-electrode 45 are respectively formed on the exposed portions of the n-type GaN clad layer 43a and the transparent electrode 44. The n-type electrodes 46 and p-type electrode 45 are formed in the shapes of lines with minimum widths and positioned parallel to each other. A passivation layer 47 is formed on the light emitting structure 43 and the p- and n-electrodes 45, 46 and punched at portions thereof to protect the portions of the p- and n-electrodes 45, 46 and the light emitting structure 43. Furthermore, a first and a second bonding electrodes 48a, 48b are formed on the passivation layer 47 as a way to insulate each other and connect to the p- and n-electrodes 45, 46 through punched portions of the passivation layer 47.

Figure 6:
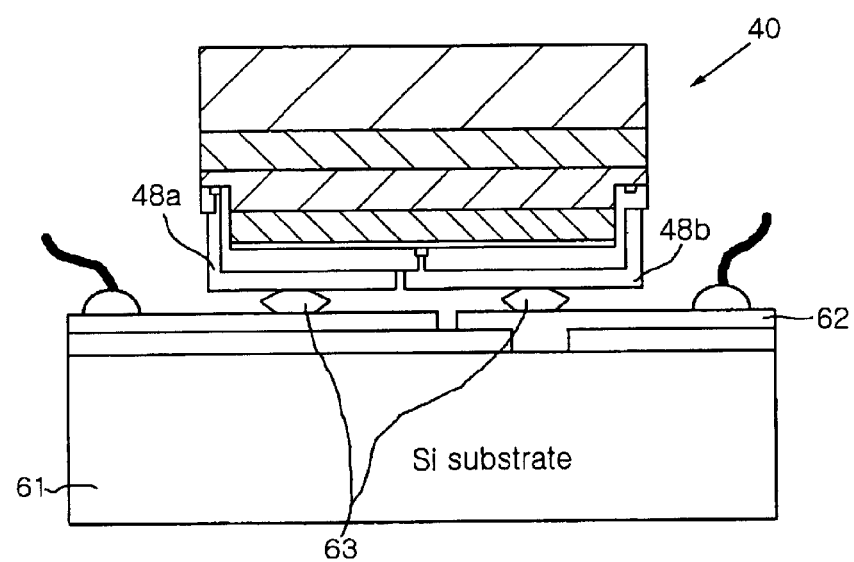
FIG. 6 illustrates the GaN light emitting diode of the present invention bonded to a Si substrate in accordance with flip-chip bonding technology.

FIG. 6 illustrates the light emitting diode 40 bonded to the Si substrate according to a flip-chip bonding technology. As shown in FIG. 6, Au bumps 63 are formed on the Si substrate 61 on which signal patterns 62 are formed, and after Au is deposited on the first and second bonding electrode 48a, 48b of the light emitting diode 40, Au portions of the first and second bonding electrode 48a, 48b are bonded to the Au portions of the Si substrate 61 using a ultrasonic wave.

At this time, the number of the Au bumps 63 may be increased from two to four by securing the first and second bonding electrodes 48a, 48b with sufficient areas. Reference numeral 49, not shown in FIG. 5, denotes the Au deposition parts which is to be bonded to the Au bumps 63 of the Si substrate 61, and the number of the Au deposition parts is four.

Therefore, a contact area between the light emitting diode chip and the Si substrate 61 with excellent thermal conductivity is increased, thereby the heat is easily discharged from the light emitting diode chip.

As described above, a light emitting diode of the present invention is advantageous in that a light emitting area and the brightness of light emitted from the light emitting diode are both increased because an area of an electrode applying an electrical current to a semiconductor material is minimized, and a uniform current diffusion effect is secured to reduce a life span decrease of the light emitting diode caused by the concentration of the electrical current into a predetermined portion because the electrodes are optimally arranged without reducing the light emitting area. Another advantage is that the light emitting diode is provided with separate bonding electrodes, thus a bonding area is sufficiently secured, thereby heat is maximally discharged from the light emitting diode through the Si substrate when the light emitting diode is flip-chip bonded to the Si substrate.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A GaN light emitting diode suitable for flip-chip bonding, said diode comprising:
  a sapphire substrate;
  a light emitting structure including a first GaN clad layer, an activation layer, and a second GaN clad layer sequentially formed on the sapphire substrate, said first GaN clad layer being exposed at one or more portions thereof, the exposed portions of the first GaN clad layer being in the shape of a line with a predetermined width;
  a plurality of first electrodes and a second electrode respectively formed on the exposed portions of the first GaN clad layer and on the second GaN clad layer, said first electrodes and second electrode being in the shape of lines parallel to each other;
  a passivation layer being formed on the light emitting structure and the first and second electrodes to protect the first and second electrodes and the light emitting structure and being punched at portions thereof; and
  a first bonding electrode and a second bonding electrode formed on the passivation layer so as to be insulated from each other and respectively connected to the first and second electrodes through the punched portions of the passivation layer.

2. The GaN light emitting diode as set forth in claim 1, wherein opposite ends of the activation layer and the second GaN clad layer are etched to expose the exposed portions of the first GaN clad layer.

3. The GaN light emitting diode as set forth in claim 1, wherein the first electrodes are formed at opposite ends of the light emitting structure, and the second electrode is positioned at a center of the light emitting structure.

4. The GaN light emitting diode as set forth in claim 1, further comprising a reflective layer positioned between the passivation layer and the first and second bonding electrodes.

5. The GaN light emitting diode as set forth in claim 1, wherein the first and second bonding electrodes are made of an alloy including a reflective material, a barrier material, and a bonding material.

6. The GaN light emitting diode as set forth in claim 1, further comprising a buffer layer positioned between the sapphire substrate and the light emitting structure.

7. The GaN light emitting diode as set forth in claim 1, further comprising a transparent electrode positioned between the second GaN clad layer of the light emitting structure and the second electrode.

8. The GaN light emitting diode as set forth in claim 4, wherein the reflective layer is made of a material selected from the group consisting of Ag, Al, Pd, Rh, and alloys thereof.

9. The GaN light emitting diode as set forth in claim 5, wherein the reflective material is one selected from the group consisting of Ag, Al, Pd, Rh, and alloys thereof.

10. The GaN light emitting diode as set forth in claim 5, wherein the barrier material is one selected from the group consisting of Ti, W, Cr, Pt, Ni, and alloys thereof.

11. The GaN light emitting diode as set forth in claim 5, wherein the bonding material is one selected from the group consisting of Au, Sn, In, and alloys thereof.

12. A method of fabricating a GaN light emitting diode suitable for flip-chip bonding, said method comprising:
  sequentially building a first GaN clad layer, an activation layer, and a second GaN clad layer on a sapphire substrate;
  etching predetermined portions of the activation layer and second GaN clad layer to expose predetermined portions of the first GaN clad layer;
  forming a transparent electrode on the second GaN clad layer;
  simultaneously forming first and second electrodes on the transparent electrode and the exposed portions of the first GaN clad layer in such a way that the first and second electrodes form lines parallel to each other;
  passivationing upper portions of the first and second GaN clad layers to form a passivation layer, and punching the passivation layer to expose predetermined portions of the first and second electrodes; and
  forming a first bonding electrode and a second bonding electrode on the passivation layer so as to be insulated from each other and to respectively connect to the first and second electrodes through the punched portions of the passivation layer.

13. The GaN light emitting diode as set forth in claim 7, wherein the passivation layer is disposed on top of the first and second electrodes, and the bonding electrodes are, in turn, disposed on top of the passivation layer.

14. A GaN light emitting diode, comprising:

a sapphire substrate;

a first GaN clad layer disposed on top of the sapphire substrate;

an active layer disposed on top of the first GaN clad layer;

a second GaN clad layer disposed on top of the active layer, wherein the second GaN clad layer and the active layer do not cover an upper surface of the first GaN clad layer in a portion of the first GaN clad layer;

a first electrode comprising a first conductive stripe on the upper surface of the first GaN clad layer in said portion of the first GaN clad layer;

a second electrode comprising a second conductive stripe on an upper surface of the second GaN clad layer;

a passivation layer disposed on top of the second GaN clad layer and said portion of the first GaN clad layer, wherein said passivation layer does not cover predetermined areas of upper surfaces of the first and second electrodes; and first and second bonding electrodes disposed on top of the passivation layer and physically and electrically connected with the first and second electrodes, respectively, in said predetermined areas of the first and second electrodes.

15. The GaN light emitting diode as set forth in claim 14, wherein said first and second stripes are parallel.

16. The GaN light emitting diode as set forth in claim 14, wherein said first electrode comprises two said first conductive stripes which are disposed at opposite end portions of said diode, wherein said first conductive stripes are not directly connected, either physically or electrically, at the level of the upper surface of the first GaN clad layer.

17. The GaN light emitting diode as set forth in claim 16, wherein, within said diode, said first conductive stripes are electrically connected exclusively via said first bonding electrode.

18. The GaN light emitting diode as set forth in claim 17, wherein said first electrode consists of two said first conductive stripes which are straight, and said second electrode consists of one said second stripe which is straight and parallel with and equidistantly spaced from said first conductive stripes.

19. The GaN light emitting diode as set forth in claim 16, wherein said passivation layer is formed with an elongated slot which is parallel with one of said first conductive stripes and through which the upper surface of said one of said first conductive stripes is exposed to be physically connected with the first bonding electrode, and two through holes which are above opposite ends of the other one of said first conductive stripes and through which the upper surface of the other one of said first conductive stripes is exposed to be physically connected with the first bonding electrode.

20. The GaN light emitting diode as set forth in clam 19, wherein said first bonding electrode is U shaped and has a middle portion located immediately above said elongated slot and two branches extending from the middle portion towards the other of said first conductive stripes and terminating in regions immediately above the through holes formed in the passivation layer;

said second bonding electrode is located between the branches of the first bonding electrode and immediately above the second electrode, said second bonding electrode being spaced from the first bonding electrode by a U-shaped gap.

21. The GaN light emitting diode as set forth in claim 14, wherein said first electrode is completely located below said second electrode;

said passivation layer comprising a side portion extending downwardly from a level above said second electrode to a level of the upper surface of said first GaN clad layer and covering side surfaces of said active layer and said second GaN clad layer;

said first bonding electrode comprising a side portion extending downwardly from the level above said second electrode to the upper surface of said first electrode and covering a side surface of said side portion of said passivation layer.

* * * * *